United States Patent [19]

Jeong et al.

[11] Patent Number: 5,231,076

[45] Date of Patent: Jul. 27, 1993

[54] PROCESS FOR MANUFACTURING A $YBA_2CU_3O_x$ SUPERCONDUCTOR USING INFILTRATION-REACTION TECHNIQUE

[75] Inventors: In K. Jeong, Seoul; Yong K. Park, Taejon; Doh Y. Kim, Seoul; Jong C. Park, Taejon, all of Rep. of Korea

[73] Assignee: Korea Standards Research Institute, Taejeon City, Rep. of Korea

[21] Appl. No.: 739,243

[22] Filed: Aug. 1, 1991

[30] Foreign Application Priority Data

Dec. 15, 1990 [KR] Rep. of Korea ............. 90-20699

[51] Int. Cl.$^5$ .................. C01F 11/04; C01G 3/02; H01L 39/24
[52] U.S. Cl. ........................... 505/1; 423/593; 423/604; 505/725; 505/742
[58] Field of Search ............ 505/1, 742, 785, 729, 505/725; 423/593, 604, 635; 501/123, 126, 152

[56] References Cited

U.S. PATENT DOCUMENTS

| 4,857,504 | 8/1989 | Hermann | 505/1 |
| 4,956,338 | 9/1990 | Rapp | 505/737 |
| 4,994,437 | 2/1991 | Torii | 505/1 |

OTHER PUBLICATIONS

Murakami et al., "A New Process with the Promise of High $J_c$ in Oxide Superconductors", 1989, pp. 1189–1194.
Murakami et al. "Microstructural Study of the Y—BA—Cu—O System at High Temperatures", 1989, pp. L399–L401.
Murakami et al. "Melt Processing of High-Temperature Superconductors", 1990.

Primary Examiner—Paul Lieberman
Assistant Examiner—John Boyd
Attorney, Agent, or Firm—Foley & Lardner

[57] ABSTRACT

A process for preparing 123 superconductor material comprising heating a 123 compact in direct physical contact with a 211 compact to decompose only the 123 compact to form a liquid phase in the 123 compact is disclosed. The heat is maintained with the liquid phase passing into the 211 compact, to form a decomposed compact and an enriched compact. The decomposed and enriched compacts are cooled to below 1000 degrees celsius to promote a peritectic reaction between the 211 grains and the infiltrated liquid phase in the 211 compact. The decomposed and enriched compacts are then further cooled to about 400–600 degrees celsius in an oxygen atmosphere, and finally cooled to room temperature to yield a fused 123 decomposed compact-123 enriched compact. The 123 superconductor having enhanced electrical and mechanical properties is the 123 enriched compact which can be separated from the decomposed compact, by severing the 123 decomposed compact from the 123 enriched compact.

18 Claims, 5 Drawing Sheets

PROCESS FOR MANUFACTURING A $YBA_2CU_3O_x$ SUPERCONDUCTOR USING INFILTRATION-REACTION TECHNIQUE

BACKGROUND OF INVENTION

1. Field of the Invention

The invention relates to a superconductor $YBa_2Cu_3O_x$ and to a process for manufacturing the superconductor $YBa_2Cu_3O_x$, and more particularly, to a process using an infiltration-reaction technique for manufacturing the superconductor $YBa_2Cu_3O_x$, hereinafter referred to as 123, having improved electrical and mechanical properties by distributing $Y_2BaCuO_5$, hereinafter referred to as 211, grains as pinning centers and substantially eliminating pores and residual liquid phase from the final product.

2. Background Information

Although 123 superconductors have a higher Tc (critical temperature) than other conventional metallic superconductors like $Nb_3Sn$ and $Nb_3Ge$, it is difficult to put 123 superconductors to practical use due to their lower Jc (critical current density). The reason for the lower Jc is that magnetic fluxes penetrate into the 123 superconductor and move through the 123 superconductor when a magnetic field larger than Hc1 (low critical magnetic field) is applied. In order to control the motion of the magnetic fluxes, it is essential to distribute pinning centers inside the 123 superconductor. The pinning centers hold or fix the penetrating magnetic fluxes so they do not move through the 123 superconductor. Of the many possible pinning centers, 211 grains are known to be the most effective in 123 superconductors.

In conventional methods, 123 superconductors, with 211 grains distributed as pinning centers, are manufactured by first decomposing a 123 powder compact into 211 grains and a liquid phase by heat treatment at 1000-1200 degrees celsius. The resulting mass is then cooled down to below 1000 degrees celsius so that the 123 superconductor is formed by the peritectic reaction between the 211 grains and the liquid phase.

When the peritectic reaction is initiated, 123 grains are nucleated on the surface of the 211 grains and grow entrapping the 211 grains. After the peritectic reaction is completed, 123 superconductor is present where the 211 grains are distributed. However, in the conventional process a residual liquid phase(s) and pores remain. The residual liquid phase(s) cannot further react with the 211 grains trapped inside the 123 grains since the 211 grains are isolated by the 123 grains from the residual liquid phase. The presence of the residual liquid phase and the closed pores deteriorate the electrical and mechanical properties of the 123 superconductor. The 123 superconductor produced by conventional methods has a volume percent of 211 grains distributed as pinning centers inside the 123 superconductor of only a maximum of about 25 volume percent.

For further explanation see: Murakami et al, "Microstructural Study of the Y-Ba-Cu-0 System At High Temperatures", Japanese Journal of Applied Physics, Vol. 28, No. 3, pp. L 399-L 401, March 1989; publication of ICMC '90 Topical Conference, "High-Temperature Superconductors, Materials Aspects", May 9-11, 1990, Garmisch-Partenkirchen, Fed. Rep. of Germany; and Murakami et al, "A New Process with the Promise of High Jc in Oxidek Superconductors", Japanese Journal of Applied Physics, Vol. 28, No. 7, pp. 1189-1194, July 1989, each of which are incorporated herein by reference as if fully set forth hereat.

Therefore, the present invention improves the electrical and mechanical properties of the 123 superconductor by evenly distributing the 211 grains as pinning centers and by substantially eliminating the presence of the residual liquid phase and the closed pores from the 123 superconductor.

It is an object of the present invention to manufacture a 123 superconductor having 211 grains evenly distributed as pinning centers to increase the Jc.

It is another object of the present invention to manufacture a 123 superconductor substantially absent any closed pores thereby enhancing the electrical and mechanical properties of the 123 superconductor.

It is another object of the present invention to manufacture a 123 superconductor substantially absent any residual liquid phase thereby enhancing the electrical and mechanical properties of the 123 superconductor.

It is another object of the present invention to manufacture a 123 superconductor a density of over 95 volume percent of the theoretical density and a volume percent of 211 grains evenly distributed as pinning centers inside the 123 superconductor of in the range of about 40 to 60 volume percent.

It is another object of the present invention to manufacture a 123 superconductor having a $\Delta M$ of as large as 56 emu/cc at zero applied field and 30 emu/cc at 1000 Oe applied field.

The preceding objects should be construed as merely presenting a few of the more pertinent features and applications of the invention. Many other beneficial results can be obtained by applying the disclosed invention in a different manner or modifying the invention within the scope of the disclosure. Accordingly, other objects and a fuller understanding of the invention may be had by referring to both the Summary of the Invention and the Detailed Description, below, which describe the preferred embodiment in addition to the scope of the invention defined by the claims considered in conjunction with the accompanying drawings.

SUMMARY OF THE INVENTION

The process for manufacturing a 123 superconductor using the infiltration-reaction technique of the present invention is defined by the claims with a specific embodiment shown in the attached drawings. For the purpose of summarizing the invention, the present invention relates to a 123 superconductor and to a process for manufacturing the 123 superconductor.

The process for preparing the 123 superconductor material according to the present invention comprises the steps of: first, providing a 123 compact and a 211 compact. The 123 compact is prepared by compacting 123 powdered material. The 211 compact is likewise prepared by compacting 211 powered material. Where the compacts are prepared by using powder, the powder preferably has a particle size within a range from 0.1 $\mu$m to 10 $\mu$m. The powder may be prepared by using calcined material ground into a powder with a particle size range from 0.1 $\mu$m to 10 $\mu$m and then compacted into compacts. Open pores are created when compacting the powder to form a compact. However, the open pores in the 123 compact are changed to closed pores by heating above 1000 degrees celsius, i.e. to yield 211 material and a liquid phase.

Sintered compacts may also be used in the instant process.

After compacting and prior to heating, the percentage of pores in the 123 compact and in the 211 compact is about 30-35% (v/v). Prior to heating, the weight of the 123 compact is about twice the weight of the 211 compact.

Second, the 123 compact is positioned on a suitable vessel, such as a platinum plate, so as to be in direct physical contact with the 211 compact in order that infiltration of the liquid phase into the 211 compact will occur during heating. Thus, the 123 compact may be either positioned on the top or bottom of the 211 compact, i.e. stacked, or the compacts may be placed side-by-side as long as they are in direct physical contact with each other. The greater the contacting area between the compacts, the better the homogenous infiltration into the 211 compact. It is believed that capillary force draws the liquid phase formed in the decomposing compact (123 compact) and into the compact not effected, i.e. not decomposed (211 compact), during the heating step, i.e. the third step. However, there may be other explanations and the inventor does not consider himself bound as capillary force being the only explanation.

Third, the compacts are heated sufficiently to form a liquid phase in the 123 compact but not sufficiently to decompose the 211 compact. That is, the 123 compact decomposes into a liquid phase and 211 material but the 211 compact remains stable when heated to about 1000-1200 degrees celsius. Preferably, the compacts are heated to about 1030 degrees celsius and most preferably to 1030 degrees celsius.

Fourth, the heat is maintained on the 123 and 211 compacts such that the liquid phase formed in the 123 compact passes into the 211 compact, to form a decomposed compact (original 123 compact) and an enriched compact (original 211 compact). The duration of this step may be very fast since most of the liquid phase, once formed, moves quickly into the 211 compact to form the liquid phase enriched compact. Preferably, the heat is maintained for about 30 minutes.

Fifth, the decomposed and enriched compacts are cooled to below 1000 degrees celsius, but above 600 degrees celsius, so that the 123 superconductor may be formed by a peritectic reaction between the 211 material and the liquid phase which infiltrated the 211 compact. Preferably, the decomposed and enriched compacts are cooled to about 970 degrees celsius over the course of about 60 minutes.

Sixth, the decomposed and enriched compacts are then cooled to about 400-600 degrees celsius in an oxygen atmosphere.

Preferably, the decomposed and enriched compacts remain under these conditions for about 24 hours.

Seventh, the decomposed and enriched compacts are then finally cooled to room temperature yielding a decomposed compact and an enriched compact. The 123 superconductor material is present in both the decomposed compact and the enriched compact. However, the 123 superconductor material of the enriched compact is better electrically and mechanically than that of the decomposed compact. Furthermore, the microstructure between the compacts is different.

To obtain the 123 superconductor material of the 123 enriched compact from the fused or chemically bonded compacts, the 123 decomposed compact is mechanically separated from the 123 enriched compact to yield the 123 enriched compact which is the 123 superconductor of the present invention. This is accomplished by the use of a diamond saw, or other cutting means, to cut the 123 decomposed compact from the 123 enriched compact.

The 123 superconductor of the enriched compact has a density of over 95 volume percent of the theoretical density and a volume percent of 211 grains evenly distributed as pinning centers inside the 123 superconductor in the range of about 40 to 60 volume percent. As a result of the even distribution of the 211 pinning centers, the Jc is increased to the extent of $10^5$ $A/cm^2$. Further, there is a substantial absence, see below, of either residual liquid phase or pores in the 123 superconductor of the enriched compact as seen in the 123 superconductor of the prior art.

The Jc of the 123 superconductor of the enriched compact may be further increased by utilizing a texturizing process which follows the above cited process conditions except that the compacts are heated in a special tube furnace. This process is well known to those skilled in the art. Briefly, such process involves placing the compacts on a platinum plate and into an alumina tube furnace, heating to 1030 degrees celsius for 30 minutes to form a decomposed and an enriched compact and slowly cooling down the compacts by moving the compacts out of the furnace through a temperature gradient in the range of 1.0 degree Celsius/mm to 10 degrees celsius/mm. The rate of movement of the platinum plate is in the range of 1 mm to 10 mm/hour. According to the process, a starting sample of 0.5 g of 211 material is placed in direct physical contact with 1.0 g 123 material in an alumina tube furnace on a platinum plate and heated to 1030 deg. C. The sample is slowly (4 mm/hr) removed from the furnace over a period of 30 minutes. This process orients the 123 grains of the 123 superconductor into the same crystallographic direction.

The more pertinent and important features of the present invention have been outlined above in order that the detailed description of the invention which follows will be better understood and that the present contribution to the art can be fully appreciated. Additional features of the invention described hereinafter form the subject of the claims of the invention. Those skilled in the art can appreciate that the conception and the specific embodiment disclosed herein may be readily utilized as a basis for modifying or designing other structures for carrying out the same purposes of the present invention. Further, those skilled in the art can realize that such equivalent constructions do not depart from the spirit and scope of the invention as set forth in the claims.

BRIEF DESCRIPTION OF THE DRAWINGS

For fuller understanding of the nature and objects of the invention, reference should be had to the following detailed description taken in conjunction with the accompanying drawings in which.

Similar reference characters refer to similar parts throughout the several views of the drawings.

DETAILED DESCRIPTION OF THE INVENTION

FIGS. 1 to 4 are schematic drawings showing the steps for manufacturing a 123 superconductor by conventional methods.

Figure 1:
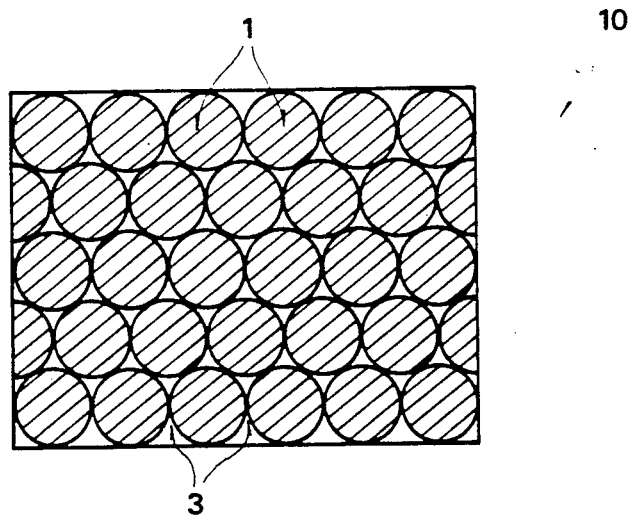
FIG. 1 to 4 are schematic drawings which show the steps for manufacturing a 123 superconductor by a conventional method.
Figure 2:
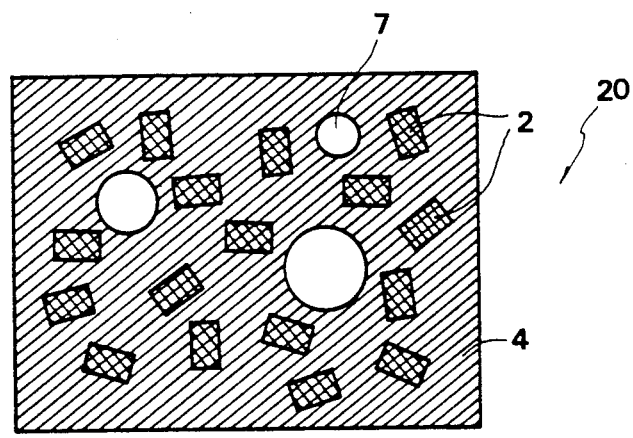

Referring first to FIG. 1, 123 powder 1 is compacted into a 123 powder compact 10. Open pores 3, i.e. those pores connected to outside of the compact, are contained in the compact 10. The force used in compacting the powder is about 300 Kg/cm$^2$. The compact has a pore volume of 30-35% (v/v). As shown in FIG. 2, the 123 powder compact is decomposed into 211 grains 2 and a liquid phase 4 by heat treatment at 1000-1200 degrees celsius. Closed pores 7, i.e. those pores which are isolated from the outside of the compact, which form from the open pores 3 (FIG. 1) are contained in the decomposed body 20.

Figure 3:
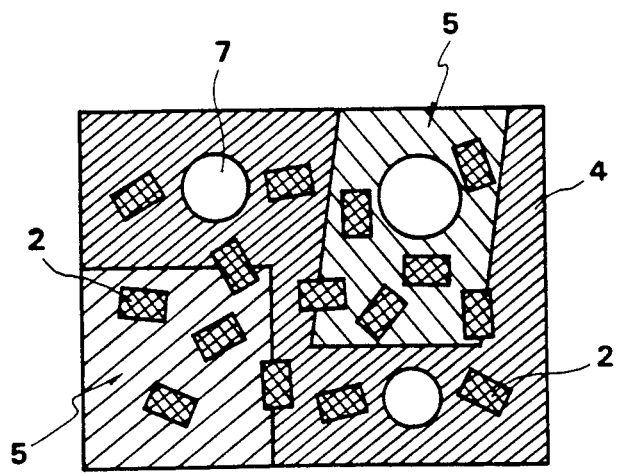

The decomposed body 20 is then cooled down to below 1000 degrees celsius so that the peritectic reaction between the 211 grains 2 and the liquid phase 4 may occur. In the initial stage of the peritectic reaction, as shown in FIG. 3, the 123 grains 5 are nucleated on the surface of some of the 211 grains 2, and grow entrapping the closed pores 7 and the 211 grains 2.

Figure 4:
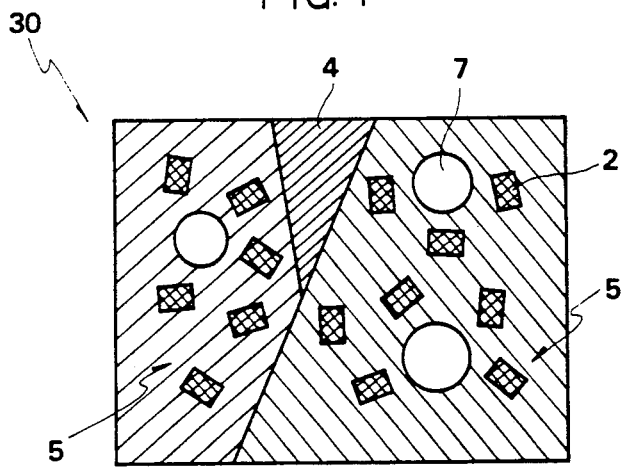

When the peritectic reaction is complete, as shown in FIG. 4, the 123 superconductor 30 with the 211 grains 2 distributed as pinning centers is produced. However, closed pores 7 remain trapped inside the 123 grains 5 and the residual liquid phase 4 remains at the 123 grain boundary because the residual liquid phase 4 cannot further react with the 211 grains 2 since the 211 grains are isolated from the residual liquid phase 4 by the surrounding 123 grains 5.

The residual liquid phase 4 and the closed pores 7 should be eliminated because they not only shut off the current flow through the superconductor but they also deteriorate the mechanical property of the resulting superconductor. Further, the better that the 211 grains are evenly distributed, the better the electrical property of the 123 superconductor.

FIGS. 5 to 8 are schematic drawings showing the steps for manufacturing a 123 superconductor according to the process of the present invention.

Figure 5:
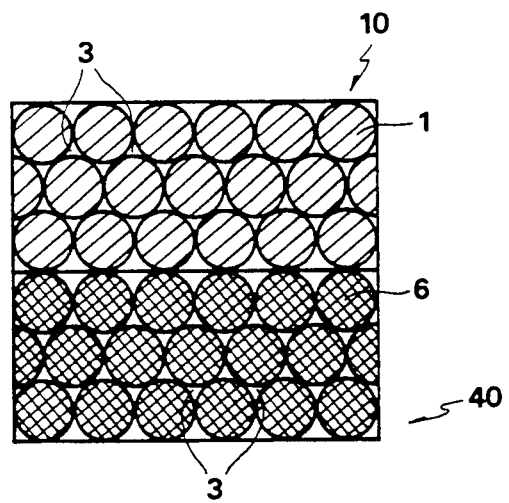
FIGS. 5 to 8 are schematic drawings which show the steps for manufacturing a 123 superconductor according to the process of the present invention using the infiltration-reaction technique.

Referring to FIG. 5, a 123 powder compact 10, prepared by compacting 123 powder 1, is placed on a 211 powder compact 40, prepared by compacting 211 powder 6. Open pores 3 are present in the compacts 10, 40. Each of the 123 and 211 powders has a particle size ranging from 0.1 $\mu$m to 10 $\mu$m. However, the particle size of the 123 powder is not as important as the particle size of the 211 powder because the 123 powder is only used as a source of liquid after being decomposed into 211 and liquid. As for the particle size of the 211 powder, the smaller the particle size the better since smaller 211 particles would be dispersed as pinning centers inside the 123 grains after the infiltration-reaction process. Therefore, the pinning property will be improved since the smaller the size of the pinning centers, the better the pinning properties of the resulting 123 superconductor. Thus, the 211 powder having a particle size range from 0.01 $\mu$m to 10 $\mu$m is used to make the 211 compact but smaller particle size as much as possible is preferable within the particle size range. Uniformity in the particle distribution of the 211 powder results in more homogenous properties in the resulting superconductor. At present, however, preparation of particle size smaller than 0.1 $\mu$m or a single particle size within the above range is hardly possible.

Figure 6:
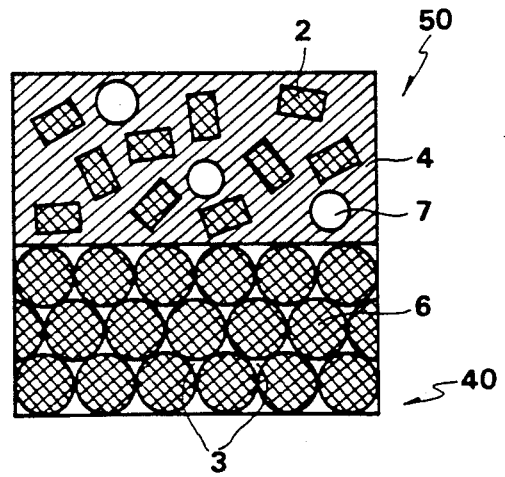

The 123 powder compact 10 is, as shown in FIG. 6, decomposed into 211 grains 2 and a liquid phase 4 by heat treatment at 1000-1200 degrees celsius, during which the open pores 3 in FIG. 5 change to closed pores 7 in FIG. 6. The 211 powder compact 20, however, does not decompose because the decomposition temperature of the 211 powder 6 is above 1200 degrees celsius.

Figure 7:
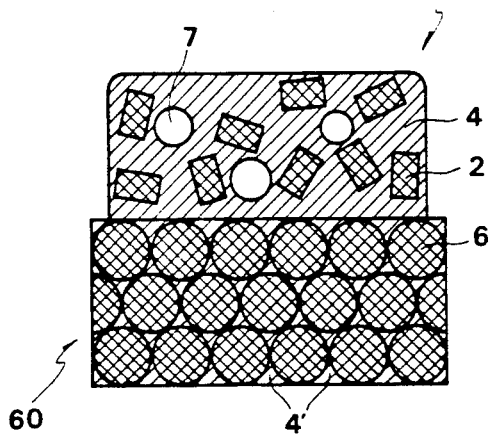

The liquid phase 4 in the decomposed body 50 infiltrates down into the open pores 3 of the 211 powder compact 40 (infiltration step) and consequently the enriched 211 powder compact 60 containing the infiltrated liquid phase 4' is obtained as shown in FIG. 7. The infiltration step is expected to be completed within a few minutes since it is induced spontaneously and suddenly by capillary force. The volume of the decomposed body 50 decreases as the liquid phase 4 infiltrates out from it and into the 211 powder compact 60.

Figure 8:
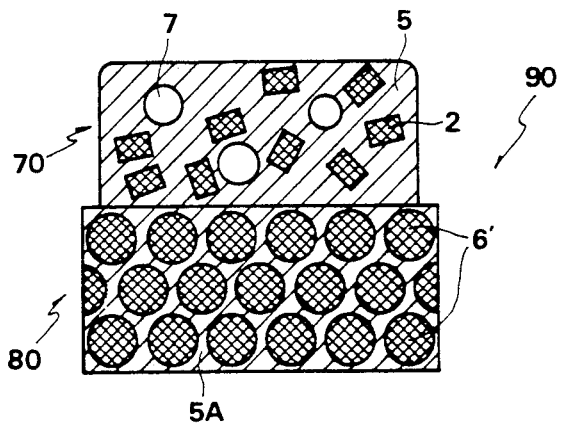

The decomposed body 50 and the enriched 211 powder compact 60 are then cooled down to below 1000 degrees celsius. During the cooling down period, the peritectic reaction occurs between the 211 grains 2 and the liquid phase 4 in the decomposed body 50, and between the 211 powder 6 and the infiltrated liquid phase 4' in the 211 powder compact 60 to form 123 superconductors 70, 80, respectively. The combined 123 superconductors 90 are referred to as a "123 decomposed compact 70-123 enriched compact 80." In the 123 decomposed compact 70, the 211 grains 2 are not evenly distributed; whereas, in the 123 enriched compact 80, the 211 grains 6' are evenly distributed in the 123 grains, as shown in FIG. 8. The numerals 5 and 5A represent 123 grains in each superconductor, respectively. The 123 superconductors obtained in both the decomposed (upper) 70 and the enriched (lower) 80 portions can be used, but the 123 enriched compact 80 is a better superconductor than the 123 decomposed compact 70 because the 123 enriched compact 80 does not contain closed pores while the 123 decomposed compact 70 contains a lot of closed pores 7. It is important to note that the 211 grains 6' illustrated in FIG. 8 are smaller than those 6 illustrated in FIG. 7. The reason for this is that the grains illustrated in FIG. 7 are consumed during the peritectic reaction, decreasing their size as they appear in FIG. 8.

During the infiltration process represented in FIGS. 6 to 7, the optimum—not excessive or deficient—amount of the liquid phase to fill all the open pores 3 in the 211 powder compact 40 should be infiltrated. That is, if the infiltrating liquid phase is excessive, a residual liquid phase would remain after the peritectic reaction is complete, and in the event the infiltrating liquid phase is deficient, there would be a liquid phase deficient region, where the peritectic reaction could not occur.

The optimum amount of the liquid phase for infiltration can be determined by regulating the amount of the 123 powder compact 10, which is the source of the infiltrating liquid phase after heat decomposition, relative to the amount of the 211 powder compact 40 to be infiltrated. Generally speaking, about twice as much 123 material is required as 211 material, by weight. Increasing the compacting force beyond 300 Kg/cm$^2$ would not change the pore volume to any substantial degree since the material cannot be further compacted.

Figure 9:
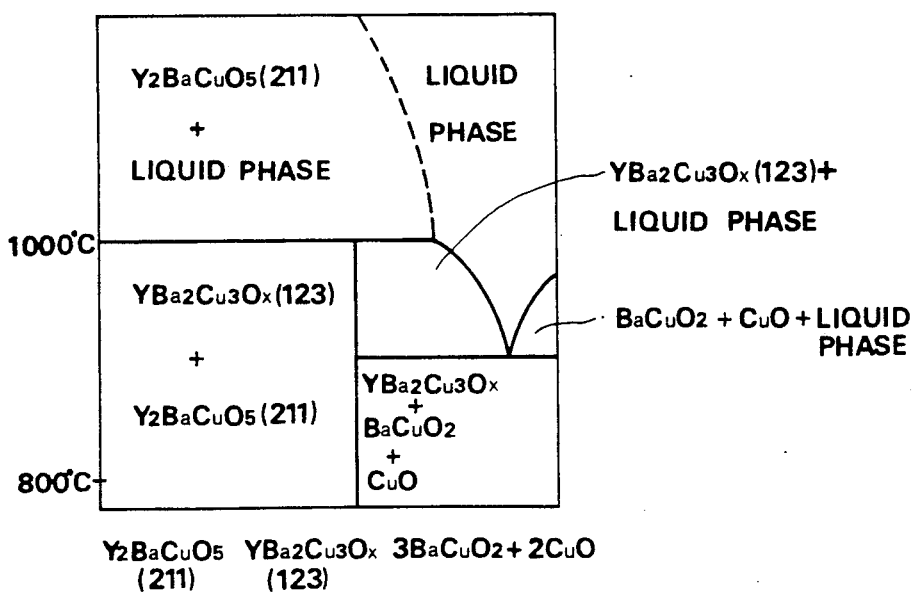
FIG. 9 is a pseudobinary phase diagram in the Y-Ba-Cu-O system.

FIG. 9 is a pseudobinary phase diagram for the Y-Ba-Cu-O system indicating approximate phase relations among 123, 211, liquid phase and temperature. The composition of the liquid phase above 1000 degrees celsius is not obvious, as indicated with the dashed line of FIG. 9. The present invention enables the preparation of the liquid phase for use in another compact which is in direct contact with the liquid phase producing compact. The prior art processes have been unable to produce a liquid phase for use in another compact as described herein. That is, the process of the present invention controls not only the amount of liquid phase prepared but also where the liquid phase so produced is to be used. This advantage over prior art processes make it possible to produce superior 123 superconductors since it is now possible to control the peritectic reaction which requires the liquid phase.

Figure 10:
FIG. 10 is a photograph of the microstructure of a 123 superconductor manufactured by a conventional method.

FIG. 10 is an optical microscope photograph which was enlarged ×500, of the a microstructure of the 123 superconductor manufactured by a conventional method. The specimen is heat-treated at 1030 degrees celsius for a period of 30 minutes. The matrix phase shows the 123 grains with small dots (211 grains) and etch patterns illustrated by lines, which are micro cracks. However, both a residual liquid phase remains, which appears white between the 123 grains, and pores remain, which appear black in the upper-left side of the microstructure.

Figure 11:
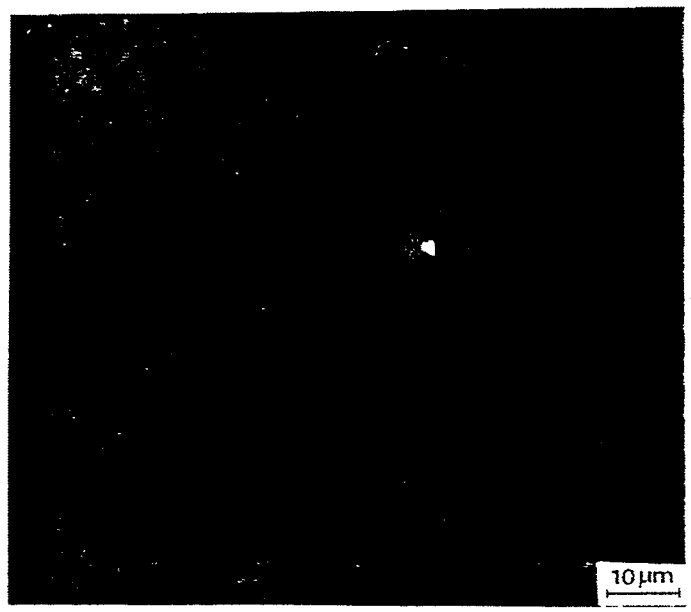
FIG. 11 is a photograph of the microstructure of a 123 superconductor manufactured according to the process of the present invention using the infiltration-reaction technique.

FIG. 11 is an optical microscope photograph, enlarged ×1000, of the microstructure of the 123 superconductor manufactured according to the present invention. The specimen is heat-treated at 1030 degrees celsius for a period of 30 minutes. The matrix phase covers all the microstructure of the 123 grains. The 211 grains appear to be small dots and are distributed inside the 123 grains. There is an absence of the residual liquid phase and of any pores. However, the presence of a residual liquid phase or a pore may occur in the microstructure of the 123 superconductor produced by the present process. Thus, the 123 superconductor produced by the present process may be considered as being "substantially absent" of the residual liquid phase and/or pore. By "substantial absence" is meant that both the residual liquid phase and the pores in the microstructure of the 123 produced by the process according to the present invention are not present at all or if present, then only present as an occasional minute residual liquid phase and/or pore. The occasional minute residual liquid phase or pore, or both, is the exception in the enriched compact. The presence of an occasional minute residual liquid phase and/or pore in a 123 superconductor which also has equally distributed pinning center has heretofore not been produced in a complete compact as described herein.

The process according to the present invention provides a 123 superconductor with the following advantages:

(1) The Jc is increased to the extent of 10$^5$ A/cm$^2$ by evenly distributing 211 grains as pinning centers inside the 123 superconductor.

(2) A 123 superconductor without either the residual liquid phase or pores and with a density of over 95 volume percent of the theoretical density, results in a 123 superconductor with improved electrical and mechanical properties.

(3) The volume percent of 211 grains distributed as pinning centers inside the 123 superconductor is increased to the extent in the range of about 40 to 60 volume percent, compared with only a maximum of about 25 volume percent by conventional methods.

(4) By conventional powder preparation methods, it is difficult to prepare the liquid phase which is indispensable for the peritectic reaction because the composition of the liquid phase above 1000 degrees celsius is not obvious as indicated with the dashed line in the phase diagram of FIG. 9. This problem, however, is successfully solved by the process of the present invention. A portion of the liquid phase 4 from the decomposed body 50 in FIG. 6 infiltrates down into open pores 3 in the 211 powder compact 40 as shown in FIG. 7 by the capillary force of the open pores 3 in the compact 60. The amount of the liquid phase 4 which infiltrates down into the 211 powder compact 40 is determined by the volume percent of the open pores in the 211 compact.

It is possible to further increase the Jc by texturizing a 123 superconductor so that the 123 grains become oriented in the same crystallographic direction. The texturizing process is accomplished by cooling down the 211 powder compact 60 containing the infiltrated liquid phase 4' in FIG. 7 under a temperature gradient as discussed above.

EXAMPLE 123 powder is prepared by mixing $Y_2O_3 + BaCO_3 + CuO$ in a ratio of Y:Ba:Cu=1:2:3. The mixture is then calcined at about 850 degrees celsius for about 24 hours. The resulting product is then ground into a powder form, i.e 123 powder.

211 powder is prepared by mixing $Y_2O_3 + BaCO_3 + CuO$ in a ratio of Y:Ba:Cu=2:1:1. The mixture is then calcined at about 900 degrees celsius for about 24 hours. The resulting product is then ground into a powder form, i.e. 211 powder. The powder form has a particle size range from 0.1 μm to 10 μm.

0.5 g of 211 powder and 1.0 g of 123 powder are compacted (300 Kg/cm$^2$) in a cylindrical mold with a diameter of 10 mm. The compacts are put on a platinum plate with the 211 compact being placed on the plate and the 123 compact being placed on the 211 compact. The compacts are heated at 1030 degrees celsius for 30 minutes in an electric furnace (ambient atmosphere) to form a decomposed compact and an enriched compact. The heated compacts are allowed to cool for 1 hour where a temperature of 970 degrees celsius is reached to promote the peritectic reaction. The furnace is then cooled to about 400–600 degrees celsius. The compacts are kept at this temperature and in an oxygen atmosphere for 24 hours to promote the formation of the orthorhombic phase ($6.5 < X < 7$) from the tetragonal phase ($6 < X < 6.5$) in order to obtain the superconductor properties. "X" is the value of oxygen nonstoichiometry in YBa$_2$Cu$_3$Ox. At the end of 24 hours, the compacts (a 123 decomposed compact and an 123 enriched compact fused together) are completely cooled to room temperature. The 123 decomposed compact is separated from the 123 enriched compact, by means of a diamond saw, to yield the 123 superconductor material of the enriched compact. The weight of the 123 decomposed compact decreases relative to the preheated weight. Whereas the weight of the 123 enriched compact increases relative to the preheated weight since the liquid phase is drawn into it. Also, the volume of 123 decomposed compact decreases relative to the pre heating volume. Whereas, the volume of the 123 enriched compact increases relative to the preheated volume since the liquid phase is drawn into it.

Figure 12:
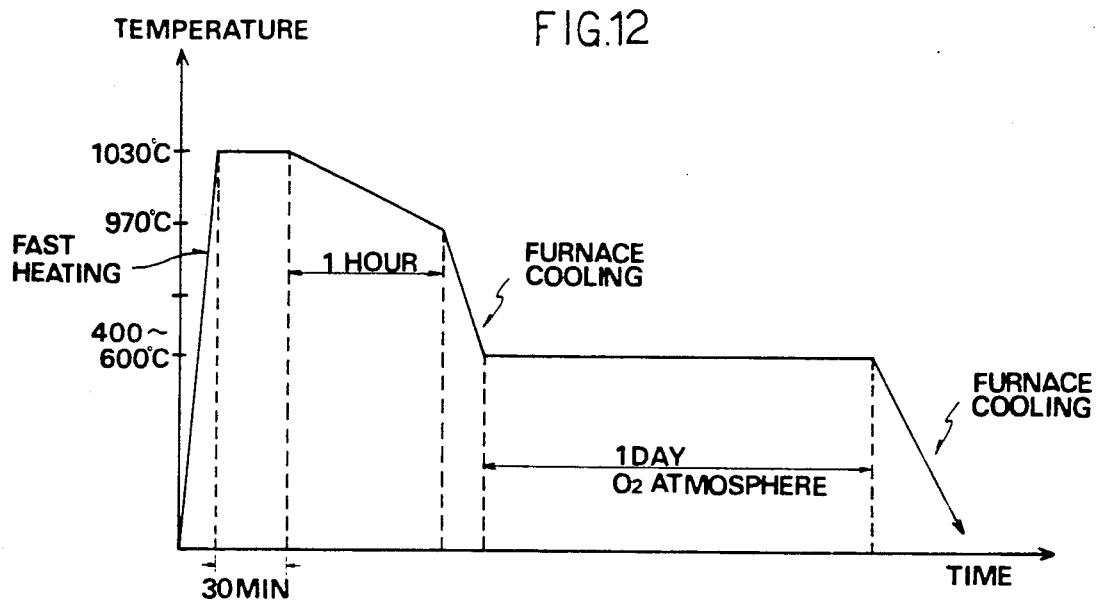
FIG. 12 is a graph illustrating the time-temperature relationship of the present invention.

FIG. 12 is a graph illustrating the time-temperature relationship of the present invention as presented in the above example.

Figure 13:
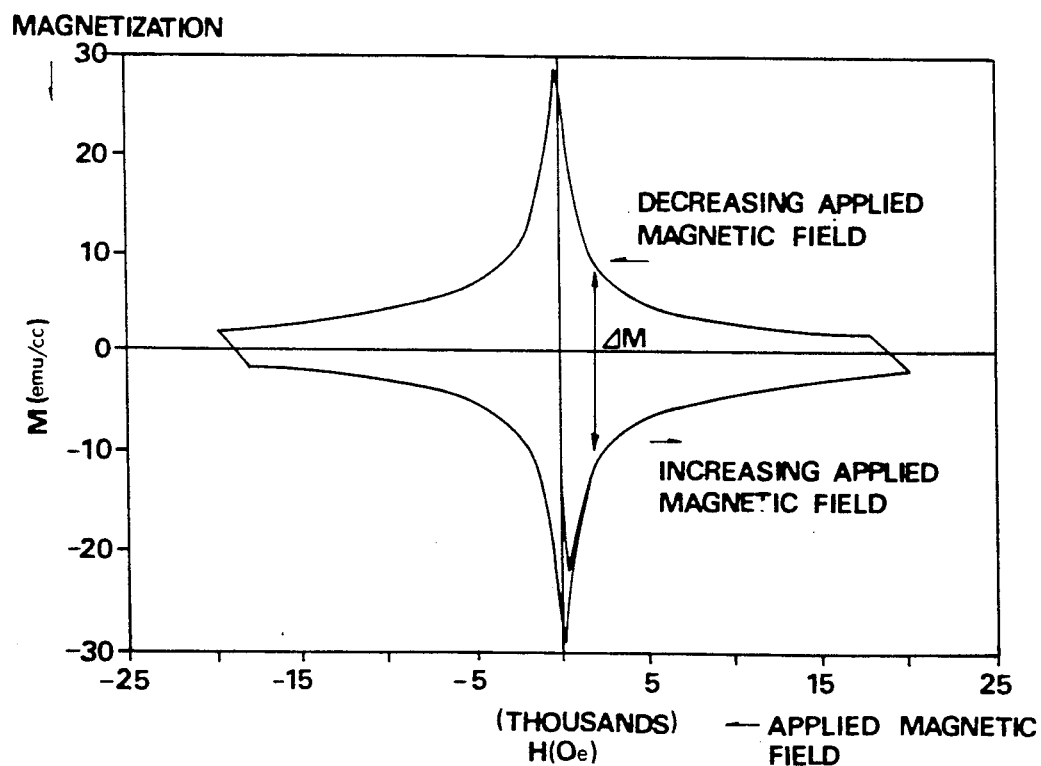
FIG. 13 is an illustration of the M-H curve of the 123 superconductor of the present invention.

FIG. 13 refers to a M-H curve (measured at 77 degrees K.) showing the magnetization of the 123 superconductor (enriched compact) when a magnetic field, H, is applied. The critical current density, Jc, is calculated by the formula Jc=30×ΔM/d. "ΔM" is the magnetization difference in the increasing and decreasing magnetic field. "d" is the average size of the 123 grains. The instant 123 superconductor, the sample taken anywhere from the enriched compact, showed ΔM of 56 emu/cc at zero applied field and ΔM of 30 emu/cc at 1000 Oe applied field, respectively. The average grain size of the 123 grains is 100 μm.

Thus, Jc=30×56 emu/cc divided by 100×10$^{-4}$ cm=1.68×10$^5$ A/cm$^2$ at zero applied field.

Thus, Jc=30×30 emu/cc divided by 100×10$^{-4}$ cm=9×10$^4$ A/cm$^2$ at 1000 Oe applied field.

While a larger ΔM is described in the prior art, see FIG. 14 of "High Temperature Superconductors" (cited above) only a single crystal like 123 specimen, rather than the entire resulting product, is tested. However, the present results are obtainable from anyplace in the entire specimen of the enriched compact produced according to the present invention.

Although the invention has been described by way of a practical embodiment, it is a matter of course that the present invention is not necessarily limited to the described embodiment, and various changes and modifications may be imparted thereto without departing from the gist of the invention.

What is claimed is:

1. A process for preparing 123 superconductor material, comprising the steps of:
   first, providing a 123 compact and a 211 compact;
   second, positioning the 123 compact and the 211 compact so as to be in physical contact with each other;
   third, heating the compacts sufficiently to decompose the 123 compact and form a liquid phase in the 123 compact but not sufficiently to decompose the 211 compact;
   fourth, maintaining the heat on the 123 and 211 compacts such that the liquid phase formed in the 123 compact passes into the 211 compact, to form a decomposed compact and an enriched compact;
   fifth, cooling the decomposed and enriched compacts to below 1000 degrees celsius but above 600 degrees celsius to promote a peritectic reaction between the 211 grains and the liquid phase in the decomposed body, and between the 211 grains and the infiltrated liquid phase in the 211 compact;
   sixth, further cooling the decomposed and enriched compacts to about 400-600 degrees celsius in an oxygen atmosphere; and,
   seventh, cooling the decomposed and enriched compacts to room temperature to yield a 123 decomposed compact—123 enriched compact.

2. The process of claim 1 wherein the 123 decomposed compact is separated from the 123 enriched compact to yield the 123 superconductor material of the enriched compact.

3. The process of claim 1 wherein the compacts are first heated in the third step to 1000-1200 degrees celsius.

4. The process of claim 3 wherein the compacts are first heated in the third step to about 1030 degrees celsius.

5. The process of claim 1 wherein the heat is maintained in the fourth step for about 30 minutes.

6. The process of claim 1 wherein the fifth step includes cooling to about 970 degrees celsius over the course of about 60 minutes.

7. The process of claim 1 wherein the sixth step includes maintaining the temperature in range of about 400-600 degrees celsius in an oxygen atmosphere for about 24 hours.

8. The process of claim 1 wherein the compacts are heated in an alumina tube furnace on a platinum plate to 1030 degrees celsius and then slowly cooled by slowly removing the compacts form the furnace thereby orientating the 123 grains of the 123 superconductor into the same crystallographic direction.

9. The process of claim 8 wherein the compacts are slowly (1-10 mm/hr) removed from the furnace over a period of 30 minutes.

10. The process of claim 1 wherein the 123 compact is positioned directly on the 211 compact to enable the liquid body formed in the 123 compact to infiltrate into the 211 compact.

11. The process of claim 1 wherein 211 compact in the first step is prepared by mixing Y$_2$O$_3$+BaCO$_3$+CuO in a ratio of Y:Ba:Cu=2:1:1, calcining the mixture at about 900 degrees celsius for about 24 hours and grinding into a powder form having a particle size range from 0.1 μm to 10 μm.

12. The process of claim 1 wherein 123 compact in the first step is prepared by mixing Y$_2$O$_3$+BaCO$_3$+CuO in a ratio of Y:Ba:Cu=1:2:3, calcining the mixture at about 850 degrees celsius for about 24 hours and grinding into a powder form having a particle size range from 0.1 μm to 10 μm.

13. The process of claim 1 wherein the weight of the 123 compact of the first step is about twice the weight of the 211 compact in the first step.

14. The process of claim 1 wherein the percentage of pores in the 123 compact prior to heating is about 30-35%.

15. The process of claim 1 wherein the percentage of pores in the 211 powder compact prior to heating is about 30-35%.

16. A process for preparing 123 superconductor material, comprising the steps of:
   first, providing a 123 compact, where the 123 compact is prepared from 123 powder having a particle size range from 0.1 μm to 10 μm and the percentage of pores in the 123 compact is about 30-35%, and a 211 compact, where the 211 compact is prepared from 211 powder having a particle size range from 0.1 μm to 10 μm and the percentage of pores in the 211 powder compact is about 30-35% and where the weight of the 123 compact is about twice the weight of the 211 compact;

second, positioning the 123 compact and the 211 compact so as to be in physical contact with each other and with the 123 compact being positioned directly on top of the 211 compact to enable the liquid body formed in the 123 compact to infiltrate downward into the 211 compact;

third, heating the compacts to about 1030 degrees celsius to decompose the 123 compact and form a liquid phase in the 123 compact but not heating sufficiently to decompose the 211 compact;

fourth, maintaining the heat for about 30 minutes on the 123 and 211 compacts such that the liquid phase formed in the 123 compact passes into the 211 compact, to form a decomposed compact and an enriched compact;

fifth, cooling the decomposed and enriched compacts to about 970 degrees celsius over the course of about 60 minutes to promote a peritectic reaction between the 211 grains and the liquid phase in the decomposed body, and between the 211 grains and the infiltrated liquid phase in the 211 compact;

sixth, further cooling the decomposed and enriched compacts to about 400-600 degrees celsius in an oxygen atmosphere for about 24 hours;

seventh, cooling the decomposed and enriched compacts to room temperature to yield a 123 decomposed compact-123 enriched compact; and separating the 123 decomposed compact from the 123 enriched compact to yield the 123 superconductor material of the enriched compact.

17. The process of claim 16 wherein the compacts are heated in an alumina tube furnace on a platinum plate to 1030 degrees celsius and then slowly cooled by slowly removing the compacts form the furnace thereby orientating the 123 grains of the 123 superconductor into the same crystallographic direction.

18. The process of claim 17 wherein the compacts are slowly (1-10 mm/hr) removed from the furnace over a period of 30 minutes.

* * * * *